United States Patent [19]

Yoshizawa et al.

[11] Patent Number: 4,803,139
[45] Date of Patent: Feb. 7, 1989

[54] ELECTROPHOTOGRAPHIC PHOTORECEPTOR

[75] Inventors: Shuji Yoshizawa; Tatsuya Ikezue, both of Tokyo, Japan

[73] Assignee: Kabushiki Kaisha Toshiba, Japan

[21] Appl. No.: 79,763

[22] Filed: Jul. 30, 1987

[30] Foreign Application Priority Data

Aug. 11, 1986 [JP]  Japan .................. 61-188316

[51] Int. Cl.$^4$ .................. G03G 5/082; G03G 5/14
[52] U.S. Cl. ........................ 430/57; 430/58; 430/65; 430/67
[58] Field of Search ................. 430/57, 58

[56] References Cited

U.S. PATENT DOCUMENTS

| | | | |
|---|---|---|---|
| 4,492,810 | 1/1985 | Ovshinsky et al. | 430/85 X |
| 4,632,894 | 12/1986 | Ohashi et al. | 430/84 |
| 4,642,413 | 2/1987 | Ovshinsky | 296/85 X |
| 4,672,015 | 6/1987 | Maruyama et al. | 430/57 |
| 4,683,184 | 7/1987 | Osawa et al. | 430/57 |
| 4,683,186 | 7/1987 | Ohashi et al. | 430/84 |
| 4,701,395 | 10/1987 | Wronski | 430/57 X |
| 4,720,444 | 1/1988 | Chen | 430/58 |
| 4,722,879 | 2/1988 | Ueno et al. | 430/57 |

FOREIGN PATENT DOCUMENTS 0066812 12/1982 European Pat. Off. .

OTHER PUBLICATIONS

Gottfried H. Dohler, *Scientific American*, "Solid-State Superlattices", vol. 249, No. 5, Nov. 1983, pp. 144-151.

*Primary Examiner*—Roland E. Martin
*Attorney, Agent, or Firm*—Foley & Lardner, Schwartz, Jeffery, Schwaab, Mack, Blumenthal & Evans

[57] ABSTRACT

An electrophotographic photoreceptor is constituted by forming a barrier layer, a photoconductive layer, and a surface layer on an aluminum substrate drum, in the order stated. The photoconductive layer of this electrophotographic photoreceptor has a superlattice structure constituted by alternately stacking thin a-SiC:H layers having carbon contents different from each other. In this superlattice structure, the optical bandgaps of the respective layers differ from each other, a-SiC:H having a higher carbon content serves as a potential barrier, and a-SiC:H having a lower carbon content serves as a potential well. When light is radiated on the photoconductive layer, a large number of photocarriers are generated. The photocarriers having one polarity pass through the barrier by way of a tuneling effect, and propagate in the photoconductive layer.

17 Claims, 4 Drawing Sheets

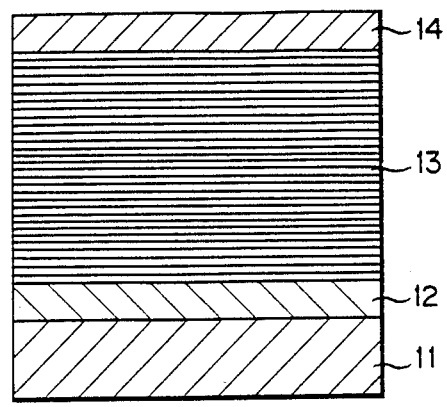
F I G. 1
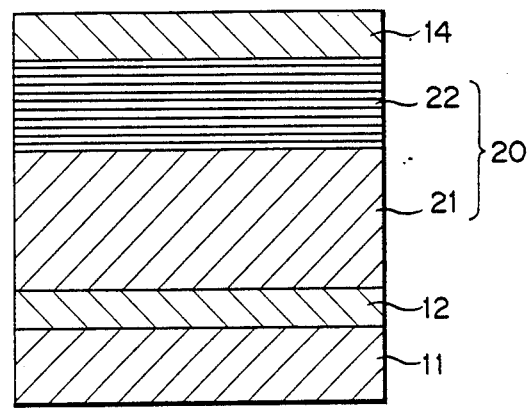
F I G. 2
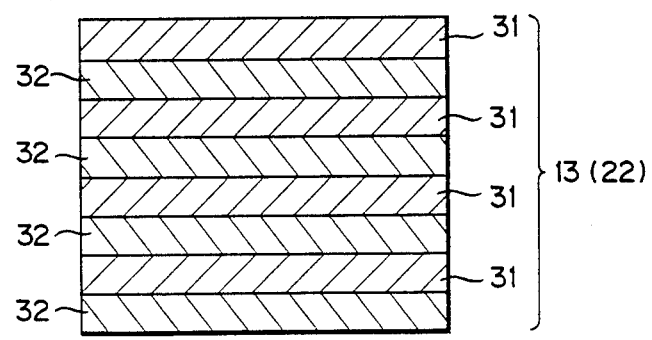
F I G. 3

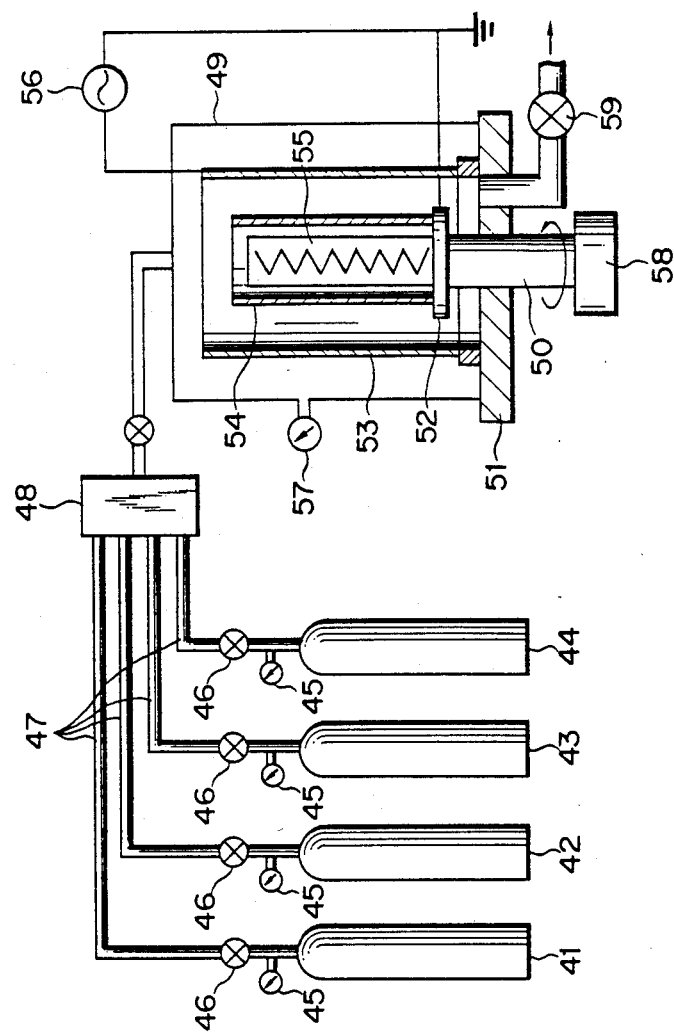
F I G. 6

ELECTROPHOTOGRAPHIC PHOTORECEPTOR

BACKGROUND OF THE INVENTION

The present invention relates to an electrophotographic photoreceptor for performing electrophotography.

Amorphous silicon containing hydrogen H (to be referred to as a-Si:H hereinafter) has received a great deal of attention as a photoconductive material, and has been used in a variety of applications, such as solar cells, thin film transistors, image sensors, and electrophotographic photoreceptors.

The materials used as the photoconductive layers in conventional electrophotographic photoreceptors can be categorized as either inorganic (e.g., CdS, ZnO, Se, or Se-Te) or organic (poly-N-vinylcarbazole (PVCZ) or trinitrofluorene). The a-Si:H has many advantages over the above-mentioned conventional organic and inorganic materials, such as that it is non-toxic and does not require recovery, high spectral sensitivity in the range of visible light is guaranteed, and high surface hardness ensures high resistance to wear, and good anti-impact properties. For this reason, a-Si:H is receiving a great deal of attention as a promising electrophotographic photoreceptor.

The a-Si:H material has been developed as an electrophotographic photoreceptor on the basis of the Carlson system. In this case, good photoreceptor properties mean high dark resistance and high sensitivity to light. However, it is difficult to incorporate these two properties in a single layer photoreceptor. A barrier layer is arranged between the photoconductive layer and a conductive support, and a surface charge-retaining layer is formed on the photoconductive layer, to constitute a multilayer structure, thereby satisfying the two requirements described above.

The a-Si:H material for use as a photoreceptor is prepared by glow discharge decomposition, using a silane gas. During the fabrication process, hydrogen is incorporated in the a-Si:H film, whereby the electrical and optical characteristics thereof are changed greatly, according to the change in hydrogen content. As the amount of hydrogen incorporated in the a-Si:H film increases, the film's optical bandgap widens and its resistance increases. Along with the increase in resistance, the sensitivity to long-wavelength light is degraded. Therefore, it is difficult to use such an a-Si:H film in a laser beam printer utilizing a semiconductor laser. When the content of hydrogen in the a-Si:H film is high, as described above, most of the components in the film can have bonding structures, such as those in $(SiH_2)_n$ and $SiH_2$, depending on film formation conditions. In this case, the number of voids and hence, the number of silicon dangling bonds, increases, thereby degrading the photoconductive characteristics of the film. Under these circumstances, the film cannot be used as an electrophotographic photoreceptor. However, when the content of hydrogen in the a-Si:H film is low, the optical bandgap is narrow and the resistance lower. As a result, the sensitivity to short-wavelength light is increased. A small content of hydrogen causes bonding of hydrogen atoms with the silicon dangling bonds, thus reducing the number of the silicon dangling bonds. For this reason, the mobility of photocarriers is degraded, thereby shortening their lifetime. At the same time, the photoconductive property of the film is degraded and the film cannot be used as an electrophotographic photoreceptor.

SUMMARY OF THE INVENTION

It is an object of the present invention to provide an electrophotographic photoreceptor wherein a large number of photocarriers can be generated upon radiation, the life of the photocarriers can be long, a wide sensitivity range from visible light range to a near-infrared range can be guaranteed, and good environmental resistance properties can be ensured.

An electrophotographic photoreceptor according to an aspect of this invention comprises: a conductive substrate; and a photoconductive layer, disposed on the substrate, for generating photocarriers upon radiation of light, the photoconductive layer including silicon and having a superlattice portion of alternately stacked thin amorphous semiconductor layers containing carbon and having carbon contents different from each other.

An electrophotographic photoreceptor according to another aspect of this invention comprises: a conductive substrate; a photoconductive layer disposed on the substrate, the photoconductive layer including a charge-generating layer for generating photocarriers upon radiation of light and a charge-transporting layer for transporting the photocarriers generated from the charge-generating layer, the charge-generating layer including silicon and having a superlattice portion of alternately stacked thin amorphous semiconductor layers containing carbon and having carbon contents different from each other.

In the electrophotographic photoreceptor of this invention, at least a portion of the photoconductive layer or the charge-generating layer is constituted by alternately stacking the thin layers as described above, and the stacked layers have optical bandgaps different from each other, thereby forming a superlattice structure at this stacked portion.

The superlattice structure has a periodic potential barrier wherein a layer having a larger optical bandgap serves as a barrier with respect to a layer having a smaller optical bandgap. In the superlattice structure, since a barrier layer is very thin, photocarriers pass through the barrier by way of a tunneling effect, and propagate in the superlattice structure. In addition, the number of photocarriers generated upon incidence of light is very large in such a superlattice structure. For this reason, the lifetime of each photocarrier generated in this area is long and mobility thereof is large, thereby significantly improving the sensitivity of the electrophotographic photoreceptor.

BRIEF DESCRIPTION OF THE DRAWINGS

A more complete appreciation of the invention and many of the attendant advantages thereof will be readily obtained, as the same become better understood by reference to the following detailed description, when considered in connection with the accompanying drawings, in which:

FIG. 1 is a sectional view of an electrophotographic photoreceptor according to an embodiment of the present invention;

FIG. 2 is a sectional view of an electrophotographic photoreceptor according to another embodiment of the present invention;

FIG. 3 is a sectional view showing part of FIGS. 1 and 2 in an enlarged scale;

FIG. 6 is a view of an apparatus for manufacturing an electrophotographic photoreceptor of the present invention.

DETAILED DESCRIPTION OF THE PREFERRED EMBODIMENT

Figure 4:
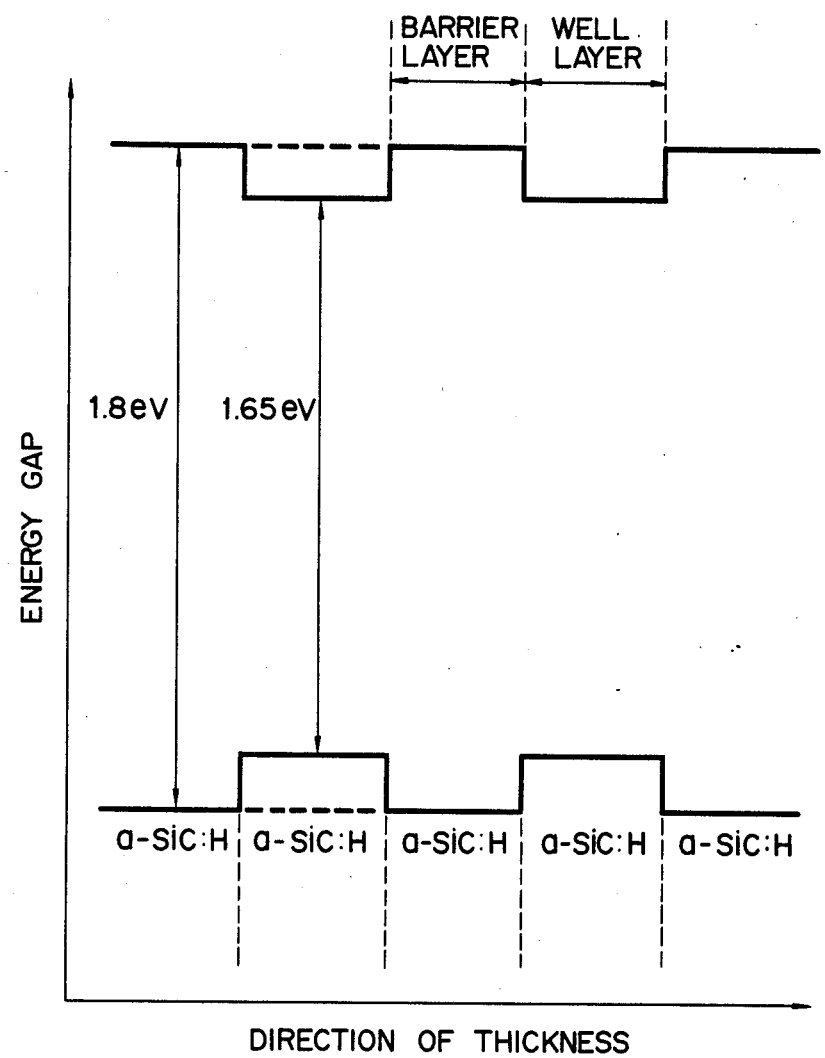
FIG. 4 is a view of an energy band of a superlattice structure.

An embodiment of the present invention will now be described in detail with reference to the accompanying drawings. FIG. 1 is a sectional view of an electrophotographic photoreceptor according to an embodiment of the present invention.

Conductive substrate 11 normally consists of aluminum and has a drum-like shape. Barrier layer 12 is formed on substrate 11, and photoconductive layer 13 for constituting a superlattice structure to be described later is formed on layer 12. Surface layer 14 is formed on layer 13 which generates photocarriers upon incidence of light. Of the generated photocarriers, those having one polarity are neutralized with electric charges on the photoreceptor surface, and those having the other polarity propagates in layer 13 to substrate 11.

FIG. 2 is a sectional view of an electrophotographic photoreceptor according to another embodiment of the present invention.

In this electrophotographic photoreceptor, photoconductive layer 20 is constituted by charge-transporting layer 21 formed on barrier layer 12 and charge-generating layer 22 formed on layer 21, and hence is of a function separating type. Other layers of the electrophotographic photoreceptor are constituted similarly to those of the electrophotographic photoreceptor shown in FIG. 1. In this function-separating-type photoconductive layer 20, layer 22 constitutes a superlattice structure. In the photoreceptor shown in FIG. 2, photocarriers are generated in layer 22 upon incidence of light, and photocarriers having one polarity propagate in layer 21 and reach substrate 11.

In the embodiment shown in FIGS. 1 and 2, each of layers 13 and 22 is constituted by alternately stacking thin layers 31 and 32 and has a heterojunction superlattice structure, as shown in a sectional view of FIG. 3 in an enlarged scale. Layers 31 and 32 have optical bandgaps different from each other and a thickness falling within a range of 30 to 500 Å. By stacking such thin layers, a quantum size effect can be obtained. If the thickness of the thin layer exceeds 500 Å, only a potential modulation effect caused by stacking can be obtained, and its property becomes an averaged one of the respective layers. Therefore, it is difficult to obtain the quantum size effect.

Layers 31 and 32 respectively consist of amorphous silicon containing hydrogen and carbon (to be referred to as a-SiC:H hereinafter) obtained by adding C to amorphous silicon containing hydrogen (to be referred to as a-Si:H hereinafter) and have carbon contents different from each other. In this case, an optical bandgap of a-SiC:H changes in accordance with its C content. That is, the higher the C content is, the larger the optical bandgap becomes, and the lower the C content is, the smaller the optical bandgap becomes. The carbon content in a-SiC:H is preferably 0.2 to 40 at%. 0.01 to 30 at% of, and more preferably, 1 to 25 at% of hydrogen is preferably added to a-SiC:H. Then, silicon dangling bonds can be compensated for, and dark and bright resistances can be balanced with each other, thereby improving the photoconductive property.

As described above, when a-SiC:H obtained by adding C to a-Si:H is used as part of layer 13 or 22, a dark resistance can be increased to improve the photoconductive property. C serves as a terminator in a silicon dangling bond to decrease a density of states present in a forbidden band between bands. For this reason, a dark resistance can be assumed to be increased.

In addition, when the conductivity type of thin a-SiC:H layers 31 and 32 are set to be p- or n-type, flow of charges from substrate 11 to the photoconductive layer can be prevented. In order to set the conductivity type of a-SiC:H to be p-type, elements belonging to Group III of the Periodic Table, e.g., boron B, aluminum Al, gallium Ga, indium In, and thallium Tl are doped. On the other hand, in order to set the conductivity type of a-SiC:H to be n-type, elements belonging to Group V of the Periodic Table, e.g., nitrogen N, phosphorus P, arsenic As, antimony Sb, and bismuth Bi are doped.

In the superlattice structure shown in FIG. 3, when a-SiC:H having a higher carbon content is used as layer 31, a-SiC:H having a carbon content lower than that of layer 31 is used as layer 32, and optical band-gaps of layer 31 and 32 are adjusted to be 1.8 and 1.65 eV, respectively, the energy band becomes as shown in FIG. 4. In this case, layer 31 having a larger optical bandgap serves as a potential barrier, and layer 32 having a smaller optical bandgap serves as a potential well.

As described above, by stacking layers 31 and 32 having optical bandgaps different from each other, a superlattice structure having a periodic potential barrier wherein a layer having a larger optical bandgap serves as a barrier with respect to a layer having a smaller optical bandgap is formed regardless of a size of the optical bandgap. In this superlattice structure, since a barrier layer is very thin, photocarriers pass through the barrier and propagate in the superlattice structure by a tunneling effect. In addition, in such a superlattice structure, the number of photocarriers generated upon incidence of light is large, so that high sensitivity to light can be obtained. Note that by varying the bandgap and the thickness of the thin layers constituting the superlattice structure, an apparent bandgap of a layer having a heterojunction superlattice structure can be arbitrarily adjusted.

By restricting the flow of charges between substrate 11 and layer 13 or 22, layer 12 improves a charge-retaining function on the photoreceptor surface, thereby improving a charging capacity of the photoreceptor.

Layer 12 may be formed by a-Si:H or microcrystalline silicon containing carbon (to be referred to as μc-SiC:H hereinafter).

Regardless of whether layer 12 is formed by μc-SiC:H or a-Si:H, when the photoreceptor surface is to be positively charged by the Carlson process, layer 12 is formed to have p-type so as to prevent injection of electrons from substrate 11 to the photoconductive layer. On the other hand, when the photoconductive surface is to be negatively charged, layer 12 is formed to have n-type so as to prevent injection of holes from substrate 11 to the photoconductive layer. In addition, a material having a high insulating property may be used as layer 12.

In order to form layer 12 to have p- or n-type, an impurity similar to that used to form the photoconductive layer to have p- or n-type may be doped. In addition, in order to form layer 12 to have a high insulating property, carbon, nitrogen, and/or oxygen may be added.

The thickness of layer 12 is preferably from 100 Å to 10 μm.

In accordance with the following physical characteristic, μc-Si:H is clearly distinguished from a-Si:H and polycrystalline silicon. That is, in an X-ray diffraction instrument, since a-Si:H is amorphous, only halo appears and no diffraction pattern can be found. On the other hand, μc-Si:H exhibits a crystal diffraction pattern obtained when $2\theta$ is around 27° to 28.5°. In addition, μc-Si:H can be adjusted to have a dark resistance of $10^{11}$ Ω·cm or more while polycrystalline silicon has a dark resistance of $10^6$ Ω·cm. This μc-Si:H consists of a phase mixture of microcrystals having a grain diameter of about several tens Å and amorphous phase.

Similar to a-Si:H, μc-Si:H can be used to form layer 12 on substrate 11 by high-frequency glow discharge decomposition using a silane gas as a source gas. In this case, if a temperature of the substrate and a high-frequency electric power are set higher than those in the case of forming a-Si:H, μc-Si:H can be formed more easily. In addition, when the substrate temperature and the high-frequency electric power are set higher, a flow rate of a source gas such as a silane gas can be increased, so that a film formation speed can be increased. Furthermore, when a gas obtained by diluting a higher silane gas such as $SiH_4$ and $Si_2H_6$ as a source gas by hydrogen is used, μc-Si:H can be formed more efficiently.

Note that in the above high-frequency glow discharge decomposition, a silicon halide gas such as an $SiF_4$ gas can be used as a source gas. In addition, μc-Si:H and a-Si:H can be similarly fabricated using a gas mixture of a silane gas and a silicon halide gas. Note that these thin layers can be formed by physical methods such as sputtering instead of glow discharge decomposition. A hydrogen or helium gas can be used as a silane carrier gas as needed.

Surface layer 14 is formed on layer 13 or 22. The μc-SiC:H constituting layer 13 or 22 has a relatively large refractive index of 3 to 3.4, so that reflection of light tends to occur on the surface thereof. When reflection of light occurs, an amount of light to be absorbed in layer 13 or 22 is decreased to increase loss of light. Therefore, layer 14 is preferably formed to prevent reflection of light. Layer 14 also serves to prevent damage to layer 22. In addition, layer 14 improves the charging capacity so that charges are sufficiently retained on the surface.

Examples of materials for forming layer 14 are inorganic materials such as a-SiN:H (amorphous silicon containing nitrogen and hydrogen), a-SiO:H (amorphous silicon containing oxygen and hydrogen), and a-SiC:H (amorphous silicon containing carbon and hydrogen), and organic materials such as polyvinyl chloride and polyamide.

Layer 21 is a layer for allowing photocarriers generated in layer 22 to reach substrate 11 with high efficiency and hence must have a long carrier lifetime and a high carrier transporting property. For this reason, layer 21 consists of a-Si:H or the like having a good carrier propagating property. In addition, since layer 21 is made of such a material, a contact property between layers 21 and 22 is improved. In this case, oxygen, carbon, and/or nitrogen is preferably added to this layer to increase a resistance, thereby improving a charge-retaining function on the photoreceptor surface.

Figure 5:
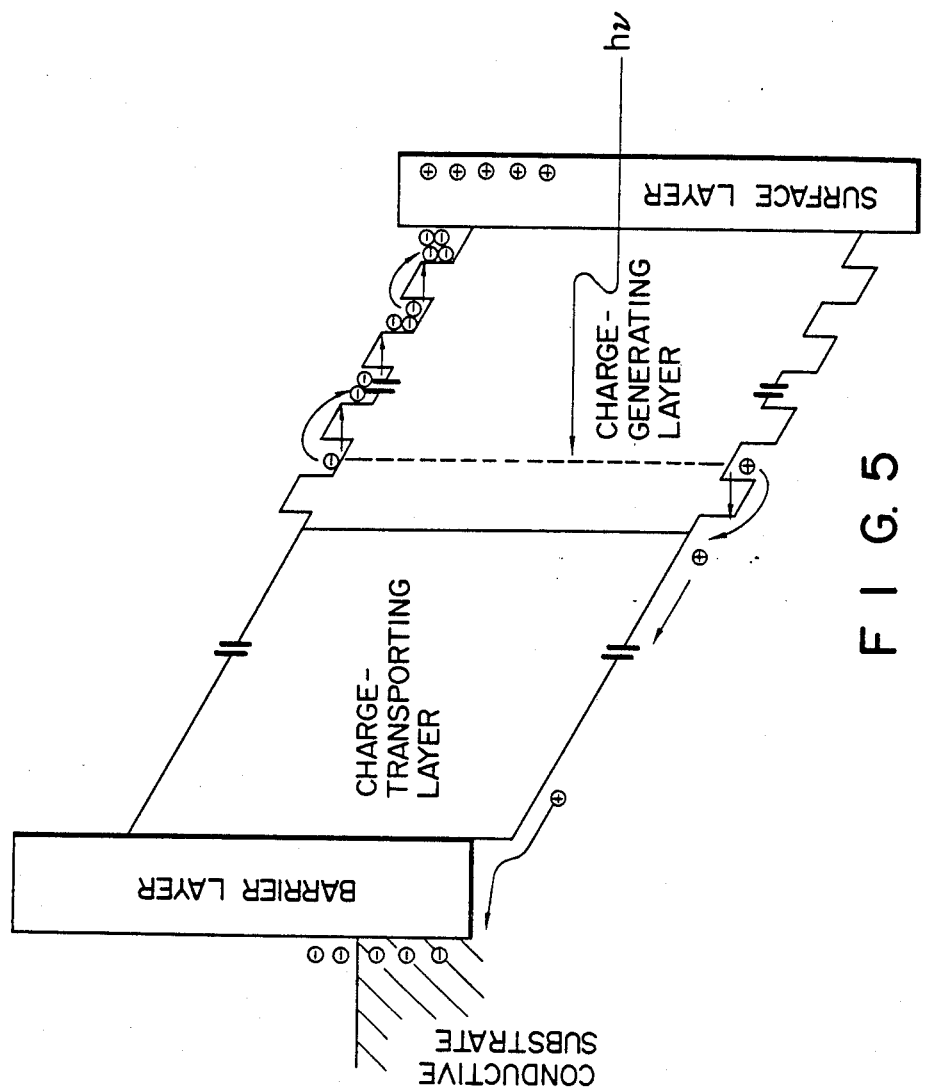
FIG. 5 is a schematic view of an energy gap of a photoreceptor.

When the surface of the electrophotographic photoreceptor having the above arrangement is charged with a positive voltage of about 500 V by corona discharge, a potential barrier as shown in FIG. 5 is formed in the case of the electrophotographic photoreceptor having the function-separating-type photoconductive layer shown in FIG. 2. When light (hν) is incident on the photoreceptor, photocarriers, i.e., electrons and holes are generated in the superlattice structure of layer 22. The electrons in the conductive layer are accelerated toward layer 14 by an electric field in the photoreceptor, and the holes are accelerated toward substrate 11. In this case, the number of photocarriers generated on the boundary between thin layers having different optical bandgaps is much larger than that of the carriers generated in the bulk. For this reason, sensitivity of light is high in this superlattice structure. In addition, in a potential well layer, a lifetime of photocarriers is increased 5 to 10 times that obtained by a single layer not having a superlattice structure because of a quantum effect. Furthermore, in the superlattice structure, a periodic barrier layer is formed due to discontinuity of the bandgap. However, the photocarriers can easily pass through the barrier layer by a tunneling effect, so that effective mobility of photocarriers is equivalent to that obtained in the bulk, thereby obtaining a good propagating property of photocarriers.

As has been described above, according to the superlattice structure obtained by stacking thin layers having optical bandgaps different from each other, a high photoconductive property can be obtained, and an image clearer than that obtained by a conventional photoreceptor can be obtained.

FIG. 6 shows an apparatus for manufacturing an electrophotographic photoreceptor according to the present invention, utilizing the glow discharge method. Gas cylinders 41, 42, 43, and 44 store source gases such as $SiH_4$, $B_2H_6$, $H_2$, and $CH_4$. Gases in cylinders 41, 42, 43, and 44 can be supplied to mixer 48, through flow control valves 46 and pipes 47 respectively. Each cylinder has pressure gage 45. The operator controls each valve 46 while monitoring corresponding pressure gage 45, thereby controlling the flow rate of each gas and their mixing ratio. The gas mixture is supplied from mixer 48 to reaction chamber 49. Rotating shaft 10 extends vertical extends from bottom 11 of reaction chamber 49, and can be rotated about the vertical axis. Disk-like support table 52 is fixed on the upper end of shaft 50 such that the surface of table 52 is perpendicular to shaft 50. Cylindrical electrode 53 is arranged inside chamber 49 such that the axis of electrode 53 is aligned with the axis of shaft 50. Drum-like substrate 54 for a photoreceptor is placed on table 52 such that the axis of the former is aligned with the axis of shaft 50. Drum-like substrate heater 55 is arranged inside substrate 54. RF power source 56 is connected between electrode 53 and substrate 54, and supplies an RF current therebetween. Rotating shaft 50 is driven by motor 58. The internal pressure of reaction chamber 49 is monitored by pressure gage 57, and chamber 49 is connected to a proper evacuating means, such as a vacuum pump, through gate valve 58.

In order to manufacture a photoreceptor in the apparatus having the construction described above, drum-like substrate 14 is placed in reaction chamber 49, and gate valve 59 is opened to evacuate chamber 49 to a vacuum of about 0.1 Torr or less. The predetermined gases from cylinders 41, 42, 43, and 44 are supplied to chamber 49, at a predetermined mixing ratio. In this case, the flow rates of the gases supplied to chamber 49 are determined such that the internal pressure of chamber 49 is set to be 0.1 to 1 Torr. Motor 58 is operated to rotate substrate 54. Substrate 54 is heated to a predetermined temperature by heater 55, and an RF current is supplied between electrode 53 and substrate 14, thereby generating a glow discharge therebetween. An a-Si:H layer is deposited on substrate 54. $N_2O$, $NH_3$, $NO_2$, $N_2$, $CH_4$, $C_2H_4$, and $O_2$ gases and the like may be added to the feed gas to add the element N, C, or O in the a-Si:H layer.

As is apparent from the above description, the electrophotographic photoreceptor according to the present invention can be manufactured in a closed-system manufacturing apparatus, thus guaranteeing the safety of the operators. Since the electrophotographic photoreceptor has high resistance to heat, to humidity, and to wear, repeated use thereof does not result in degradation; thus, a long service life is assured.

Electrophotographic photoreceptors according to the present invention were formed, and their electrophotographic characteristics were tested in the following manner.

EXAMPLE 1

An aluminum drum substrate having a diameter of 80 mm and a length of 350 mm and subjected to oxygen, alkali, and sandblast treatments as needed to prevent interference, was mounted in a reaction chamber, and the interior of the reaction chamber was exhausted by a diffusion pump (not shown) to obtain a vacuum pressure of about $10^{-5}$ Torr. Thereafter, the drum substrate was heated to a temperature of 250° C. and rotated at 10 rpm, and an $SiH_4$ gas with a flow rate of 500 SCCM, a $B_2H_6$ gas with a flow rate ratio of $10^{-6}$ to the $SiH_4$ gas, and a $CH_4$ gas with a flow rate of 100 SCCM were supplied into the reaction chamber, so that the interior of the reaction chamber was adjusted to be 1 Torr. Then, a high-frequency electric power of 13.56 MHz was applied to an electrode to generate plasma of $SiH_4$, $B_2H_6$, and $CH_4$ between the electrode and the substrate, thereby forming a barrier layer consisting of p-type a-SiC:H.

Then, the $B_2H_6/SiH_4$ ratio was set to be $10^{-7}$, and a high-frequency electric power of 500 W was applied to form a 20-$\mu$m charge-transporting layer consisting of i-type a-Si:H.

Thereafter, discharge was temporarily stopped, and the $SiH_4$, $CH_4$, and $H_2$ gases, respectively with flow rates of 500, 10, and 750 SCCM were supplied into the reaction chamber to adjust the reaction pressure to be 1.2 Torr. Then, a high-frequency electric power of 500 W was applied to form a 50-Å thin a-SiC:H layer. Thereafter, flow rates of the $SiH_4$, $H_2$ and $CH_4$ gases were set to be 500, 750 and 2.5 SCCM, respectively, the flow rate of the $B_2H_6$ gas was set to obtain the $B_2H_6/SiH_4$ ratio of $10^{-7}$, and a high-frequency electric power of 500 W was applied to form a 50-Å thin a-SiC:H layer having a carbon content lower than that of the above thin layer. The above operation was repeated to alternately stack 250 thin a-Si:H layers having carbon contents different from each other, thereby forming a 5-$\mu$m charge-generating layer with a heterojunction superlattice structure. Then, a 0.1-$\mu$m surface layer of a-SiC:H was formed.

When the photoreceptor surface thus formed was positively charged at about 500 V and exposed to white light, the light was absorbed in the charge-generating layer, and photocarriers of electron-hole pairs were generated. In this test example, a large number of photocarriers were generated, and a long lifetime and a high propagating property of photocarriers were obtained. As a result, a clear image of high quality was obtained. In addition, when the photoreceptor manufactured in this test example was repeatedly charged, a transferred image was proved to have very good reproducibility and stability and was superior in durabilities such as high resistance to corona, humidity, and wear. Furthermore, the photoreceptor thus manufactured has a high sensitivity to light having a long wavelength of 780 to 790 nm which is an oscillation wavelength of a semiconductor laser. When the photoreceptor was mounted in a semiconductor laser printer to form an image by the Carlson process, a clear image was obtained with high resolution even when an exposure amount of the photoreceptor was 25 erg/cm$^2$. Note that even when the photoreceptor was exposed to normal light and repeatedly charged as in the case of the white light, a transferred image had good reproducibility and stability and was superior in durabilities such as high resistance to corona, humidity, and wear.

EXAMPLE 2

In this example, an arrangement of layers was the same as that in Example 1 except that the barrier layer was p-type $\mu$c-SiC:H. In this case, flow rates of the $SiH_4$, $H_2$, and $CH_4$ gases were set to be 100, 1,500, and 20 SCCM, respectively, and a flow rate of the $B_2H_6$ gas was set to obtain a $B_2H_6/SiH_4$ ratio of $1 \times 10^{-2}$. Then, the above gases were supplied into the reaction chamber, and a high-frequency electric power of 1.2 KW was applied at a reaction pressure of 1.5 Torr, thereby forming a 0.5-$\mu$m thin layer. A degree of crystallization and a crystal grain diameter of the layer were 65% and 70 Å, respectively.

When the electrophotographic photoreceptor thus obtained was mounted in a semiconductor laser printer and an image was formed by the Carlson process, a clear image was obtained with high resolution in both cases. In addition, when the photoreceptor was repeatedly charged, an image was proved to have good reproducibility and stability and was superior in durabilities such as high resistance to corona, humidity, and wear.

Note that in the above examples, a thickness of the charge-transporting layer was 5 $\mu$m, but it is not limited to this value. For example, when the thickness is set to be, e.g., 1 or 3 $\mu$m, the photoreceptor can be similarly put into practical use.

In addition, although a-SiC:H was used for thin layers, it is a matter of course that materials are not limited to this.

Furthermore, the number of types of the thin films are not limited to two as in the above examples, but three or more types of thin layers may be stacked. More specifically, a boundary need only be formed between thin layers having optical bandgaps different from each other.

What is claimed is:

1. An electrophotographic photoreceptor comprising:
   a conductive substrate; and
   a photoconductive layer, disposed on said substrate, for generating photocarriers upon irradiation with light, said photoconductive layer having a superlattice portion of two types of alternating semicondcutor layers comprised of amorphous silicon, said tyes differing is carbon content for each other, wherein each of said semiconductor layers (i) contains hydrogen and carbon, and (ii) has a thickness of between about 30 and 500 Å.

2. A photorecpetor according to claim 1, further comprising a barrier layer, interposed between said substrate and said photoconductive layer, said barrier layer comprising at least one semiconductor layer selected from the group consisting of a layer comprised of amorphous silicon containing hydrogen and a layer comprised of microcrystalline silicon containing hydrogen.

3. A photoreceptor according to claim 2, wherein said barrier layer contains an element belonging to Group III or V of the Periodic Table.

4. A photoreceptor according to claim 2, wherein said barrier layer contains at least one element selected from the group consisting of carbon, oxygen, and nitrogen.

5. A photoreceptor according to claim 1, further comprising
a surface layer disposed on said photocoductive layer.

6. A photoreceptor according to claim 1, wherein said photoconductive layer contains an element belonging to Group III or v of the Periodic Table.

7. An electrophotographic photoreceptor comprising:
a conductive substrate; and
a photoconductive layer disposed on said substrate, said photoconductive layer including (i) a charge-generating layer for generating photocarriers upon irradiation with light and (ii) a charge-transporting layer for transporting the photocarrires generated from said charge-generating layer, said charge-generating layer having a superlattice portion of two types of alternating semiconductor layers comprised of amorphous silicon, said types differing in carbon content from each other, wherein each of said semiconductor layers (i) contains hydrogen and carbon, and (ii) has a thickness of between about 30 and 500 Å.

8. A photoreceptor according to claim 7, further comprising a barrier layer, interposed between said substrate and said photoconductive layer, said barrier layer comprising at least one semiconductor layer selected from the group consisting of a layer comprised of amorphous silicon containing hydrogen and a layer comprised of microcrystalline silicon containing hdyrogen.

9. A photoreceptor according to claim 8, wherein
said barrier layer contains an element belonging to Group III or V of the Periodic Table.

10. A photoreceptor according to claim 8, wherein
said barrier layer contains at least one element selected from the group consisting of carbon, oxygen, and nitrogen.

11. A photoreceptor according to claim 8, further comprising
a surface layer disposed on said photoconductive layer.

12. A photoreceptor according to claim 8, wherein
said photoconductive layer contains an element belonging to Group III or V of the Periodic Table.

13. A photoreceptor according to claim 7, wherein said charge-transporting layer contains amorphous silicon containing hydrogen.

14. A photoreceptor according to claim 5 wherein the surface layer comprises at least one member selected from the group consisting of amorphous silicon containing nitrogen and hydrogen; amorphous silicon containing oxygen and hydrogen; amorphous silicon containing carbon and hydrogen; polyvinyl chloride and polyamide.

15. A photoreceptor according to claim 11, wherein the surface layer comprises at least one member selected from the group consisting of amorphous silicon containing nitrogen and hydrogen, amorphous silicon containing oxygen and hydrogen, amorphous silicon containing carbon and hydrogen, polyvinyl choride and polyamide.

16. A photoreeptor according to claim 2, wherein said mircrocrystalline silicon containing hydrogen has (i) an x-ray diffraction pattern at 2θ equal to about 27° to 28.5° and (ii) a dark resistanoe of about $10^{11}$ Ωcm.

17. A photoreceptor according to claim 8, wherein said microcrystaslline silicon containing hydrogen has (i) an x-ray diffraction pattern at 2θ equal to about 27° to 28.5° and (ii) a dark resistance of about $10^{11}$ Ωcm.

* * * * *